(12) United States Patent
Tani

(10) Patent No.: US 6,326,308 B1
(45) Date of Patent: Dec. 4, 2001

(54) METHOD FOR MANUFACTURING SEMICONDUCTOR STORAGE ELEMENT

(75) Inventor: Kouichi Tani, Tokyo (JP)

(73) Assignee: Oki Electric Industry, Co., Ltd. (JP)

( * ) Notice: Subject to any disclaimer, the term of this patent is extended or adjusted under 35 U.S.C. 154(b) by 0 days.

(21) Appl. No.: 09/621,344

(22) Filed: Jul. 21, 2000

(30) Foreign Application Priority Data

Jul. 30, 1999 (JP) .................................................. 11-217402

(51) Int. Cl.[7] ........................ H01L 21/302; H01L 21/461
(52) U.S. Cl. ............................................. 438/689; 438/714
(58) Field of Search ...................... 438/689, 714

(56) References Cited

U.S. PATENT DOCUMENTS 6,127,277 * 10/2000 DeOrnellas et al. ................. 438/714

OTHER PUBLICATIONS

Nakamura et al., Study of Ferroelectric Thin Films for Application to NDRO Nonvolatile Memories:, Technical Report of IEICE SDM 93136, pp. 53–59, (1993).

* cited by examiner

Primary Examiner—Felisa Hiteshew
(74) Attorney, Agent, or Firm—Venable; James R. Burdett

(57) ABSTRACT

A method in which a gate structure having a ferroelectric film and a conductor film is processed easily and without causing damage is provided. A first $IrO_2$ film is deposited on a substrate. A ferroelectric film is formed by applying a light-sensitive sol-gel solution containing a ferroelectric material dissolved therein onto the first $IrO_2$ film. A difference in solubility at the time of development is made between an exposed portion and an unexposed portion of the light-sensitive sol-gel solution. A second $IrO_2$ film is deposited on the ferroelectric film. A shading film and an etching mask of predetermined patterns are formed on the second $IrO_2$ film. The second $IrO_2$ film is processed using the etching mask and an upper electrode is formed. The pattern of the shading film is transferred to the ferroelectric film by effecting exposure. An exposed region of the ferroelectric film is removed by effecting development. Only an unexposed region remains as a ferroelectric film. The first $IrO_2$ film is processed using the etching mask and a lower electrode is thereby formed.

16 Claims, 4 Drawing Sheets

METHOD FOR MANUFACTURING SEMICONDUCTOR STORAGE ELEMENT

BACKGROUND OF THE INVENTION

1. Field of the Invention

The present invention relates to a method for manufacturing a semiconductor storage element utilizing a ferroelectric material.

2. Description of the Related Art

A ferroelectric material has the property of spontaneous polarization and is characterized by reversing a direction of its spontaneous polarization in accordance with an applied electric field. There are two types of semiconductor storage elements in which spontaneous polarization of the ferroelectric material is utilized. One is of a so-called one-transistor type, and another is of a so-called one-transistor/one-capacitor type. There has recently been expected realization of the one-transistor type due to reasons that high-speed operation is possible, nondestructive readout of data can be effected, and high integration can be expected.

An example of the one-transistor type semiconductor storage element is disclosed in "Technical Report of IEICE SDM93-136, pp. 53–59". According to Metal/Ferroelectric/Metal/Insulator/Semiconductor (MFMIS) structure disclosed herein, an insulating film, a lower electrode, a ferroelectric film, and an upper electrode are formed in layers on a semiconductor substrate in that order. This structure is provided for the reason that the ferroelectric film does not satisfactorily grow on a semiconductor or an insulator. In the MFMIS structure, it suffices that the ferroelectric film (for example, a film of lead titanate-zirconate, or a film of bismuth strontium tantalate) may be formed on a conductor film (for example, a platinum (Pt) film), and therefore, film formation is facilitated.

Further, when voltage is applied to the ferroelectric film, charge is accumulated in the ferroelectric film itself due to residual polarization of the ferroelectric film. Specifically, when positive voltage is applied to the ferroelectric film, positive charge is accumulated therein. On the other hand, when negative voltage is applied to the ferroelectric film, negative charge is accumulated therein. In a semiconductor storage element having the MFMIS structure, the accumulated charge excites charge on the surface of a semiconductor substrate. Accordingly, even if applied voltage is 0 volt, a switching operation of a transistor, namely, on state or off state is selectively maintained. As a result, data is written in the ferroelectric film. Further, current flowing between a source electrode and a drain electrode varies in accordance with the switching state of a transistor, and therefore, readout of data is made possible by detecting the variation of current.

However, processing of the above-described ferroelectric film and conductor film cannot easily be carried out by reactive ion etching (RIE) normally used in a semiconductor process, and therefore, it is necessary to effect processing by milling using argon gas. In this method, however, selectivity with a gate oxide film cannot be obtained, and therefore, there is a possibility that a semiconductor (silicon substrate) be damaged, thereby interfering with an operation of a finished product.

SUMMARY OF THE INVENTION

Accordingly, there has conventionally been required the advent of a method for manufacturing a semiconductor storage element, in which a gate structure including a ferroelectric film and a conductor film can be easily processed without causing damage thereto.

In accordance with a first aspect of the present invention, there is provided a method for manufacturing a semiconductor storage element, which comprises the steps of: (a) depositing a first conductor layer on a substrate; (b) applying, onto the first conductor layer, a light-sensitive solution with a ferroelectric material dissolved therein to form a ferroelectric film, the light-sensitive solution making a difference in solubility at the time of development between an exposed portion and an unexposed portion thereof; (c) depositing a second conductor layer on the ferroelectric layer; (d) forming, on the second conductor layer, a shading film and an etching mask of predetermined patterns; (e) transferring the pattern of the shading film to the ferroelectric layer by effecting exposure; (f) processing the exposed ferroelectric layer by effecting development; and (g) processing the first conductor layer and the second conductor layer using the etching mask.

As described above, the ferroelectric layer can easily be processed by exposure and development processes and other portions are not damaged. Further, the first and second conductor layers are processed by etching, and therefore, selectivity with other portions can easily be obtained and no damage is caused to other portions.

Further, in the method for manufacturing a semiconductor storage element of the present invention, according to a second aspect of the present invention, the first conductor layer and the second conductor layer are each comprised of iridium dioxide ($IrO_2$).

The iridium dioxide ($IrO_2$) layer is excellent in processability, and therefore, the first and second conductor layers can easily be processed.

In accordance with a third aspect of the present invention, the first conductor layer and the second conductor layer are each comprised of platinum (Pt).

In accordance with a fourth aspect of the present invention, the first conductor layer and the second conductor layer are each comprised of gold (Au).

In accordance with a fifth aspect of the present invention, the first conductor layer and the second conductor layer are each comprised of ruthenium dioxide ($RuO_2$).

In accordance with a sixth aspect of the present invention, the ferroelectric material is bismuth strontium tantalate ($SrBi_2Ta_3O_9$).

In accordance with a seventh aspect of the present invention, the light-sensitive solution is a light-sensitive sol-gel solution.

In accordance with an eighth aspect of the present invention, there is provided a method for manufacturing a semiconductor storage element, which comprises the steps of: (a) forming a silicon dioxide ($SiO_2$) region, as an element isolation region, on an n-type Si substrate; (b) forming an $SiO_2$ film, as a gate oxide film, on the n-type Si substrate; (c) depositing a first conductor layer; (d) forming a ferroelectric film on the first conductor layer; (e) depositing a second conductor layer on the ferroelectric film; (f) forming, on the second conductor layer, a shading film and an etching mask of predetermined patterns; (g) etching the second conductor layer by a reactive ion etching process using the etching mask to form an upper electrode; (h) effecting exposure with irradiation of ultraviolet rays; (i) removing an exposed portion of the ferroelectric film by effecting development; (j) etching the first conductor layer by a reactive ion etching process using the etching mask to form a lower electrode; (k)

removing the etching mask and the shading film by wet etching using hydrofluoric acid and ammonia hyperhydration, respectively; and (l) forming a source/drain region and a wiring structure.

In accordance with a ninth aspect of the present invention, in the above-described method of the eighth aspect, the first conductor layer and the second conductor layer are each comprised of $IrO_2$.

In accordance with a tenth aspect of the present invention, in the above-described method of the eighth aspect, the first conductor layer and the second conductor layer are each comprised of Pt.

In accordance with an eleventh aspect of the present invention, in the above-described method of the eighth aspect, the first conductor layer and the second conductor layer are each comprised of Au.

In accordance with a twelfth aspect of the present invention, in the above-described method of the eighth aspect, the first conductor layer and the second conductor layer are each comprised of $RuO_2$.

In accordance with a thirteenth aspect of the present invention, in the above-described method of the eighth aspect, the ferroelectric film is formed by applying a light-sensitive sol-gel solution containing a ferroelectric material dissolved therein using a spin coating process.

In accordance with a fourteenth aspect of the present invention, in the above-described thirteenth aspect, the ferroelectric material is $SrBi_2Ta_3O_9$.

In accordance with a fifteenth aspect of the present invention, in the above-described method of the eighth aspect, the step (f) includes the sub-steps: (a) depositing a titanium (Ti) film as the shading film; (b) depositing an $SiO_2$ film as the etching mask; (c) applying a resist; (d) patterning the resist by a photolithography process to form a resist pattern; (e) etching the $SiO_2$ film and the Ti film by a reactive ion etching process using the resist pattern as a mask; and (f) removing the resist pattern by using an ashing device.

In accordance with a sixteenth aspect of the present invention, the above-described method of the eighth aspect further comprises the steps of: (a) after forming the gate oxide film, depositing a polycrystalline Si film; and (b) after removing the etching mask and the shading film, etching the polycrystalline Si film using the upper electrode used as a mask.

DESCRIPTION OF THE PREFERRED EMBODIMENTS

Referring now to the attached drawings, an embodiment of the present invention will be described. In these drawings, the shape, size, and configuration relationship are merely shown schematically to such an extent that the present invention can be understood. Further, conditions such as numerical values, and examples of material, which will be described later, are each merely shown as an example. Therefore, the present invention is not limited to the embodiment described herein.

With reference to FIGS. 1A to 1E, 2A to 2D, 3A to 3E, 4A, and 4B, a method for manufacturing a semiconductor storage element according to the embodiment of the present invention will be hereinafter described sequentially for each manufacturing stage. Here, a case of making ferroelectric memory of MFMIS type will be described as an example. FIGS. 1A to 4B are cross sectional diagrams of a memory cell portion, which are used for illustration of the manufacturing method according to the present embodiment.

Figure 1A:
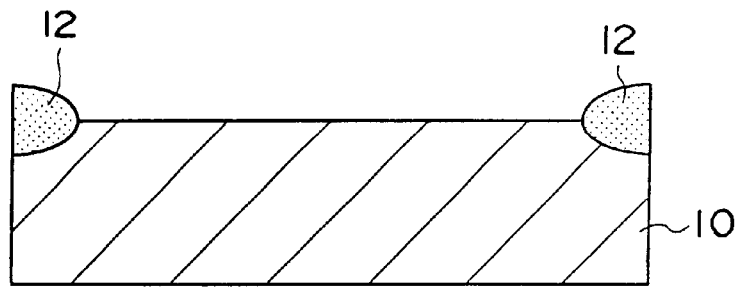
FIGS. 1A to 1E show a manufacturing process according to an embodiment of the present invention.
Figure 1B:
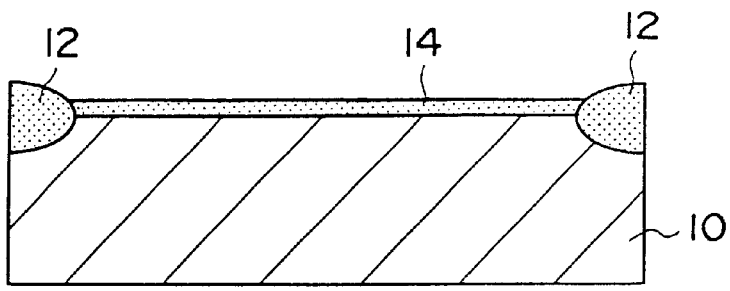
Figure 1C:
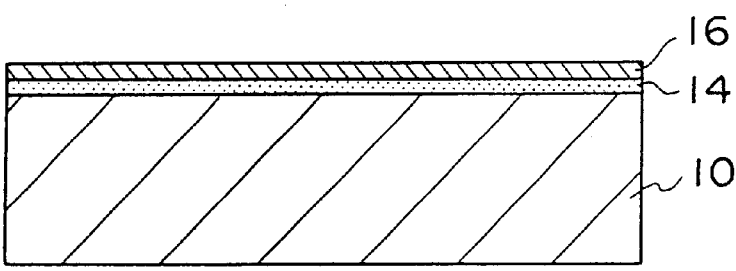

First, a silicon dioxide ($SiO_2$) region serving as an element isolation region 12 is formed on an upper surface of an n-type silicon substrate 10 by normal oxidation treatment (see FIG. 1A). Subsequently, an $SiO_2$ film serving as a gate oxide film 14 is formed on the surface of the n-type silicon substrate 10 (see FIG. 1B). Here, the $SiO_2$ film having a thickness of 100 Å is formed by a rapid heating apparatus (RTA). A first conductor layer, a ferroelectric layer, and a second conductor layer are sequentially formed in layers on a substrate prepared in the above-described process. In FIG. 1C and subsequent figures, illustration of the element isolation region 12 is omitted.

Next, a polycrystalline silicon (polysilicon) film 16 having a thickness of 2000 Å is formed in a layered manner on an upper surface of the gate oxide film 14 (see FIG. 1C). The polysilicon film 16 may not particularly be provided.

Figure 1D:
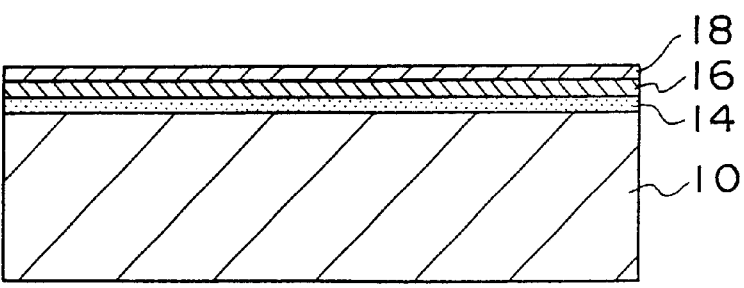

An iridium dioxide ($IrO_2$) film 18 serving as the first conductor layer is formed in a layered form on an upper surface of the polysilicon film 16 (see FIG. 1D). In a subsequent process, the $IrO_2$ film 18 is processed and formed as a lower electrode. The $IrO_2$ film is easily etched, and therefore, processing thereof is facilitated (for example, see "the 58-th Japanese Academy of Applied Physics—Academic Lecture Preliminary Reports 2nd part 2p-PA-20, p515, 1997").

Figure 1E:
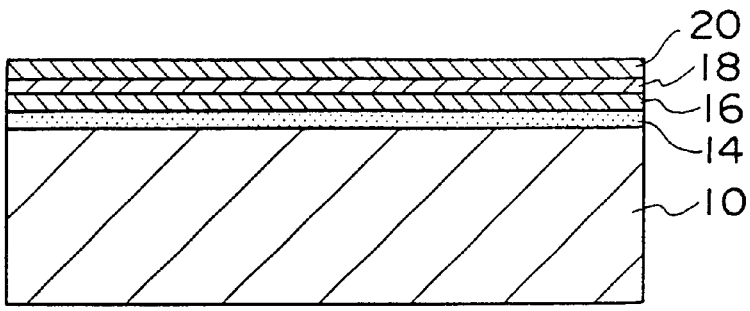

Further, a ferroelectric film 20 serving as a ferroelectric layer is formed on an upper surface of the $IrO_2$ film 18 (see FIG. 1E). In the present embodiment, the ferroelectric film 20 is formed in such a manner that a light-sensitive sol-gel solution in which ferroelectric material is dissolved is applied onto the $IrO_2$ film 18. An exposed portion and an unexposed portion of the light-sensitive sol-gel solution have different solubilities at the time of development. Accordingly, when the ferroelectric film 20 is processed in a later process, no etching is required. In this case, bismuth strontium tantalate ($SrBi_2Ta_3O_9$, hereinafter referred to as SBT) is used as the ferroelectric material. The light-sensitive sol-gel solution in which SBT is dissolved is applied onto the $IrO_2$ film 18 by spin coating and an SBT film having a thickness of 3000 Å is formed as the ferroelectric film 20.

Figure 2A:
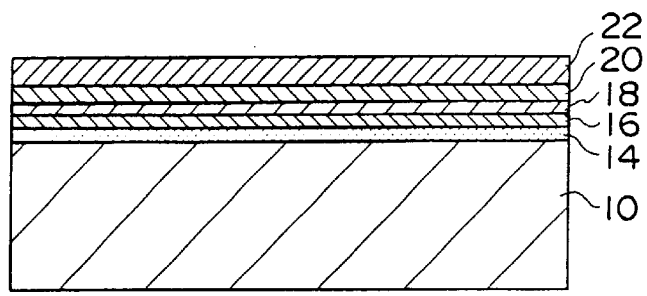
FIGS. 2A to 2D show the manufacturing process according to the embodiment of the present invention continued from FIG. 1E.
Figure 2B:
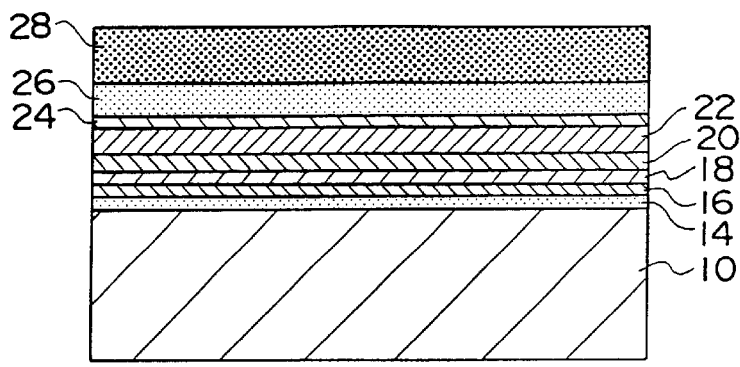

An $IrO_2$ film 22 serving as a second conductor layer is formed in a layered form on an upper surface of the ferroelectric film 20 (see FIG. 2A). The $IrO_2$ film 22 is formed in such a manner as in the $IrO_2$ film 18.

Next, a shading film and an etching mask of a predetermined pattern are sequentially formed on the $IrO_2$ film 22. First, a titanium (Ti) film 24 having a thickness of 100 Å is formed, as the shading film, on an upper surface of the $IrO_2$ film 22 (see FIG. 2B). Subsequently, a silicon oxide film 26 having a thickness of 300 Å is formed, as the etching mask, on an upper surface of the titanium film 24 (see FIG. 2B). Further, a resist 28 is deposited on an upper surface of the silicon oxide film 26 (see FIG. 2B). This deposition process is conducted by a well-known technique. The above-described titanium film 24 is used to cut off ultraviolet rays. The shading film is not limited to the titanium film 24 and any other material which cuts off ultraviolet rays may also be used as the shading film.

Figure 2C:
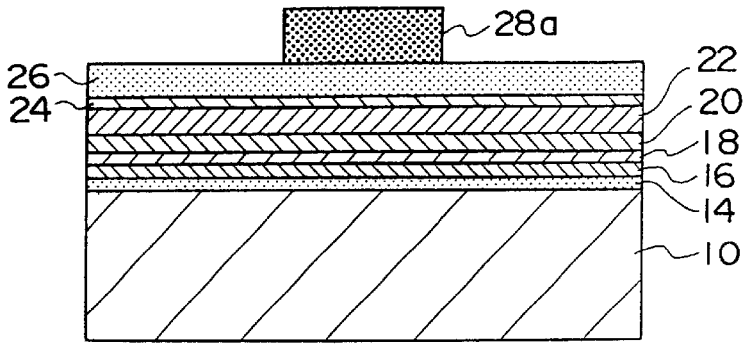
Figure 2D:
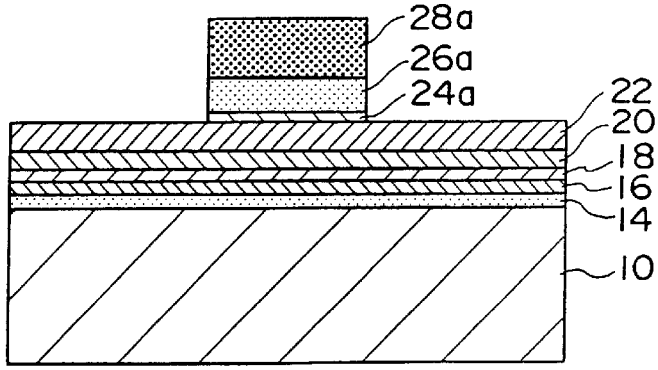
Figure 3A:
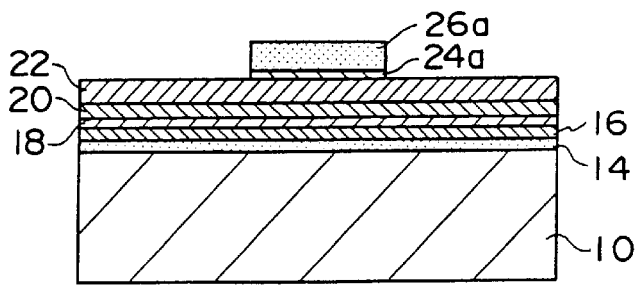
FIGS. 3A to 3E show the manufacturing process according to the embodiment of the present invention continued from FIG. 2D.
Figure 3B:
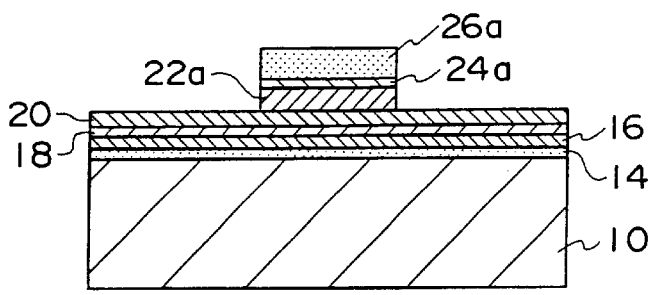
Figure 3C:
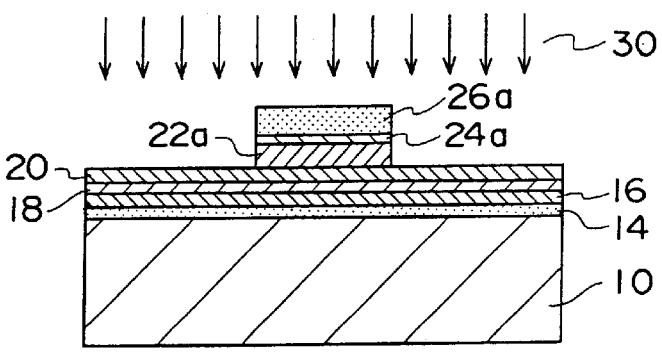
Figure 3D:
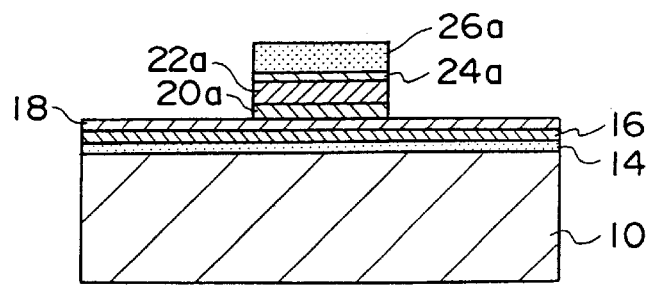
Figure 3E:
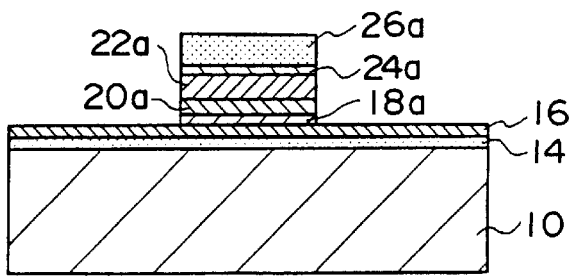

Subsequently, due to patterning of the resist 28 using normal photolithography, a resist pattern 28a is formed (see FIG. 2C). When the silicon oxide film 26 and the titanium film 24 are processed by ion etching (RIE) with the resist pattern 28a being used as a mask, a shading film 24a and an etching mask 26a of a predetermined pattern are obtained (see FIG. 2D). Thereafter, the resist pattern 28a is removed by a known ashing device (see FIG. 3A).

Next, the $IrO_2$ film 22 is processed by RIE using the etching mask 26a. As a result, an upper electrode 22a of a pattern in common with that of the etching mask 26a is formed on the ferroelectric film 20 (see FIG. 3B).

A pattern of the shading film 24a is transferred to the ferroelectric film 20 by exposure. For this reason, ultraviolet rays 30 are applied to an entire surface of a wafer (see FIG. 3C). The ferroelectric film 20 in a region in which no shading film 24a is provided is exposed, and therefore, a latent image of the pattern of the shading film 24a is formed in the ferroelectric film 20.

Subsequently, the exposed ferroelectric film 20 having been subjected to development is processed. The ferroelectric film 20 is immersed in a predetermined developer and an exposed portion of the ferroelectric film 20 is removed. As a result, only an unexposed portion on which no ultraviolet rays is applied remains as the ferroelectric film 20a (see FIG. 3D). As a result, the ferroelectric film can easily be processed in the same way as in an ordinary photolithography process.

Next, the $IrO_2$ film 18 is processed by RIE using the etching mask 26a. As a result, a lower electrode 18a of a pattern in common with that of the etching mask 26a is formed on the polysilicon film 16 (see FIG. 3E), and the surface of the polysilicon film 16 is exposed.

Figure 4A:
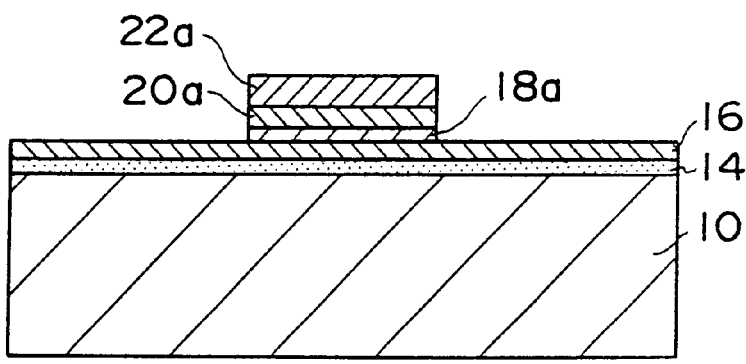
FIGS. 4A and 4B show the manufacturing process according to the embodiment of the present invention continued from FIG. 3E.
Figure 4B:
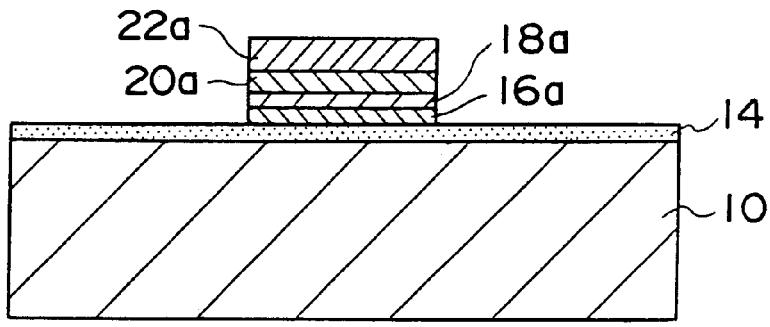

In this state, the etching mask 26a and the shading film 24a are removed by wet etching using 1% hydrofluoric acid and ammonia hyperhydration (see FIG. 4A). Subsequently, the polysilicon film 16 is etched using the upper electrode 22a as an etching mask, and the surface of the gate oxide film 14 is exposed (see FIG. 4B). A principal portion of memory is thus formed. Thereafter, a memory cell is completed so long as a source/drain region, a wiring structure, and the like are formed by a well-known technique.

As described above, the ferroelectric material is dissolved in the light-sensitive solution in which an exposed portion and an unexposed portion have different solubilities at the time of development, and the solution thus obtained is applied so as to form the ferroelectric layer. Accordingly, the ferroelectric layer can be processed without using etching in the same way as in photolithography.

In the present embodiment, iridium dioxide ($IrO_2$) is used as materials for the upper and lower electrodes, but the present invention is not limited to the same. For example, such materials as platinum (Pt), gold (Au), and ruthenium dioxide ($RuO_2$) may also be used.

Further, the ferroelectric material is not limited to SBT and other ferroelectric materials can also be used.

According to the method for manufacturing a semiconductor storage element of the present invention, the ferroelectric layer can easily be processed by exposure and development processes, and other portions are not damaged. Further, the first and second conductor layers can be processed by etching, and therefore, selectivity with other portions can easily be obtained and no damage is caused to other portions.

What is claimed is:

1. A method for manufacturing a semiconductor storage element, comprising the steps of:

(a) depositing a first conductor layer on a substrate;

(b) applying, onto the first conductor layer, a light-sensitive solution with a ferroelectric material dissolved therein to form a ferroelectric film, the light-sensitive solution making a difference in solubility at the time of development between an exposed portion and an unexposed portion thereof;

(c) depositing a second conductor layer on the ferroelectric layer;

(d) forming, on the second conductor layer, a shading film and an etching mask of predetermined patterns;

(e) transferring the pattern of the shading film to the ferroelectric layer by effecting exposure;

(f) processing the exposed ferroelectric layer by effecting development; and (g) processing the first conductor layer and the second conductor layer using the etching mask.

2. A method for manufacturing a semiconductor storage element according to claim 1, wherein the first conductor layer and the second conductor layer are each comprised of iridium dioxide ($IrO_2$).

3. A method for manufacturing a semiconductor storage element according to claim 1, wherein the first conductor layer and the second conductor layer are each comprised of platinum (Pt).

4. A method for manufacturing a semiconductor storage element according to claim 1, wherein the first conductor layer and the second conductor layer are each comprised of gold (Au).

5. A method for manufacturing a semiconductor storage element according to claim 1, wherein the first conductor layer and the second conductor layer are each comprised of ruthenium dioxide ($RuO_2$).

6. A method for manufacturing a semiconductor storage element according to claim 1, wherein the ferroelectric material is bismuth strontium tantalate ($SrBi_2Ta_3O_9$).

7. A method for manufacturing a semiconductor storage element according to claim 1, wherein the light-sensitive solution is a light-sensitive sol-gel solution.

8. A method for manufacturing a semiconductor storage element, comprising the steps of:

(a) forming a silicon dioxide ($SiO_2$) region, as an element isolation region, on an n-type Si substrate;

(b) forming an $SiO_2$ film, as a gate oxide film, on the n-type Si substrate;

(c) depositing a first conductor layer;

(d) forming a ferroelectric film on the first conductor layer;

(e) depositing a second conductor layer on the ferroelectric film;

(f) forming, on the second conductor layer, a shading film and an etching mask of predetermined patterns;

(g) etching the second conductor layer by a reactive ion etching process using the etching mask to form an upper electrode;

(h) effecting exposure with irradiation of ultraviolet rays;

(i) removing an exposed portion of the ferroelectric film by effecting development;

(j) etching the first conductor layer by a reactive ion etching process using the etching mask to form a lower electrode;

(k) removing the etching mask and the shading film by wet etching using hydrofluoric acid and ammonia hyperhydration, respectively; and (l) forming a source/drain region and a wiring structure.

9. A method for manufacturing a semiconductor storage element according to claim 8, wherein the first conductor layer and the second conductor layer are each comprised of $IrO_2$.

10. A method for manufacturing a semiconductor storage element according to claim 8, wherein the first conductor layer and the second conductor layer are each comprised of Pt.

11. A method for manufacturing a semiconductor storage element according to claim 8, wherein the first conductor layer and the second conductor layer are each comprised of Au.

12. A method for manufacturing a semiconductor storage element according to claim 8, wherein the first conductor layer and the second conductor layer are each comprised of $RuO_2$.

13. A method for manufacturing a semiconductor storage element according to claim 8, wherein the ferroelectric film is formed by applying a light-sensitive sol-gel solution containing a ferroelectric material dissolved therein using a spin coating process.

14. A method for manufacturing a semiconductor storage element according to claim 13, wherein the ferroelectric material is $SrBi_2Ta_3O_9$.

15. A method for manufacturing a semiconductor storage element according to claim 8, wherein said step (f) includes the sub-steps:

(a) depositing a titanium (Ti) film as the shading film;

(b) depositing an $SiO_2$ film as the etching mask;

(c) applying a resist;

(d) patterning the resist by a photolithography process to form a resist pattern;

(e) etching the $SiO_2$ film and the Ti film by a reactive ion etching process using the resist pattern as a mask; and (f) removing the resist pattern by using an ashing device.

16. A method for manufacturing a semiconductor storage element according to claim 8, further comprising the steps of:

(a) after forming the gate oxide film, depositing a polycrystalline Si film; and (b) after removing the etching mask and the shading film, etching the polycrystalline Si film using the upper electrode used as a mask.

\* \* \* \* \*